United States Patent
Kim et al.

(10) Patent No.: US 10,224,217 B1
(45) Date of Patent: Mar. 5, 2019

(54) WAFER LEVEL FAN OUT PACKAGE AND METHOD OF FABRICATING WAFER LEVEL FAN OUT PACKAGE

(71) Applicant: Amkor Technology, Inc., Tempe, AZ (US)

(72) Inventors: Jin Young Kim, Seoul (KR); Doo Hyun Park, Gwangju-si (KR); Seung Jae Lee, Namyangju-si (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/965,617

(22) Filed: Dec. 10, 2015

Related U.S. Application Data

(63) Continuation of application No. 14/017,802, filed on Sep. 4, 2013, now Pat. No. 9,214,434, which is a continuation of application No. 13/302,501, filed on Nov. 22, 2011, now Pat. No. 8,552,556.

(51) Int. Cl.
*H01L 21/48* (2006.01)
*H01L 21/56* (2006.01)

(52) U.S. Cl.
CPC ........ *H01L 21/486* (2013.01); *H01L 21/4853* (2013.01); *H01L 21/565* (2013.01)

(58) Field of Classification Search
CPC .. H01L 21/486; H01L 21/4853; H01L 21/565
USPC .................................................. 257/738, 774
See application file for complete search history.

(56) References Cited

U.S. PATENT DOCUMENTS

| | | | |
|---|---|---|---|
| 7,858,440 B2 | 12/2010 | Pressel et al. | |
| 7,884,464 B2 | 2/2011 | Yew et al. | |
| 8,143,099 B2 | 3/2012 | Park et al. | |
| 8,552,556 B1 | 10/2013 | Kim et al. | |
| 9,214,434 B1 | 12/2015 | Kim et al. | |
| 2001/0010627 A1* | 8/2001 | Akagawa | H01L 23/3121 361/761 |
| 2002/0175402 A1* | 11/2002 | McCormack | H01L 23/16 257/686 |
| 2007/0020914 A1* | 1/2007 | Higashi | H01L 21/486 438/618 |
| 2007/0296065 A1 | 12/2007 | Yew et al. | |
| 2008/0036065 A1* | 2/2008 | Brunnbauer | H01L 21/568 257/686 |
| 2008/0136004 A1* | 6/2008 | Yang | H01L 24/96 257/686 |
| 2009/0049686 A1* | 2/2009 | Park | H01L 24/24 29/837 |
| 2009/0236686 A1* | 9/2009 | Shim | H01L 21/568 257/528 |
| 2010/0019390 A1 | 1/2010 | Jung | |

(Continued)

*Primary Examiner* — Whitney Moore
*Assistant Examiner* — Herve-Louis Y Assouman
(74) *Attorney, Agent, or Firm* — McAndrews, Held & Malloy, Ltd.

(57) ABSTRACT

A wafer level fan out package includes a semiconductor die having a first surface, a second surface, and a third surface. A stiffener is disposed on the third surface of the semiconductor die. A conductive via passes through the stiffener. First and second electrically conductive patterns electrically connected to the conductive via are disposed on the first and second surfaces of the semiconductor die and stiffener. Solder balls are electrically connected to the first or second electrically conductive patterns.

20 Claims, 10 Drawing Sheets

(56) References Cited

U.S. PATENT DOCUMENTS

| | | | |
|---|---|---|---|
| 2010/0052135 A1* | 3/2010 | Shim | H01L 21/568 257/686 |
| 2010/0144101 A1* | 6/2010 | Chow | H01L 21/561 438/127 |
| 2010/0237477 A1* | 9/2010 | Pagaila | H01L 21/561 257/660 |
| 2010/0244216 A1* | 9/2010 | Huang | H01L 21/561 257/686 |
| 2011/0210426 A1 | 9/2011 | Matsui | |
| 2011/0221054 A1* | 9/2011 | Lin | H01L 21/568 257/692 |
| 2012/0032338 A1 | 2/2012 | Komori | |
| 2012/0119373 A1 | 5/2012 | Hunt et al. | |
| 2012/0161332 A1 | 6/2012 | Chua et al. | |
| 2012/0241949 A1 | 9/2012 | Sasaki et al. | |
| 2012/0282767 A1 | 11/2012 | Jin et al. | |
| 2012/0286407 A1 | 11/2012 | Choi et al. | |

* cited by examiner

WAFER LEVEL FAN OUT PACKAGE AND METHOD OF FABRICATING WAFER LEVEL FAN OUT PACKAGE

CROSS-REFERENCE TO RELATED APPLICATIONS/INCORPORATION BY REFERENCE

The present application is a continuation of U.S. application Ser. No. 14/017,802, titled FAN-OUT SEMICONDUCTOR PACKAGE, filed Sep. 4, 2013, presently pending and issuing as U.S. Pat. No. 9,214,434; which is a continuation of U.S. application Ser. No. 13/302,501, titled WAFER LEVEL FAN OUT PACKAGE, filed Nov. 22, 2011, now U.S. Pat. No. 8,552,556. The above-identified applications are hereby incorporated herein by reference in their entirety.

TECHNICAL FIELD

The present application relates to a wafer level fan out package and a method of fabricating the wafer level fan out package.

BACKGROUND

Wafer level fan out packages are fabricated by attaching semiconductor dies onto adhesive tape, encapsulating the semiconductor dies with an encapsulant, removing the adhesive tape from the semiconductor dies and the encapsulant, forming a redistribution layer on the semiconductor dies and the encapsulant, attaching solder balls to the redistribution layer, and sawing the semiconductor dies into semiconductor devices.

BRIEF DESCRIPTION OF THE DRAWINGS

In the following description, the same or similar elements are labeled with the same or similar reference numbers.

DETAILED DESCRIPTION

Figure 1:
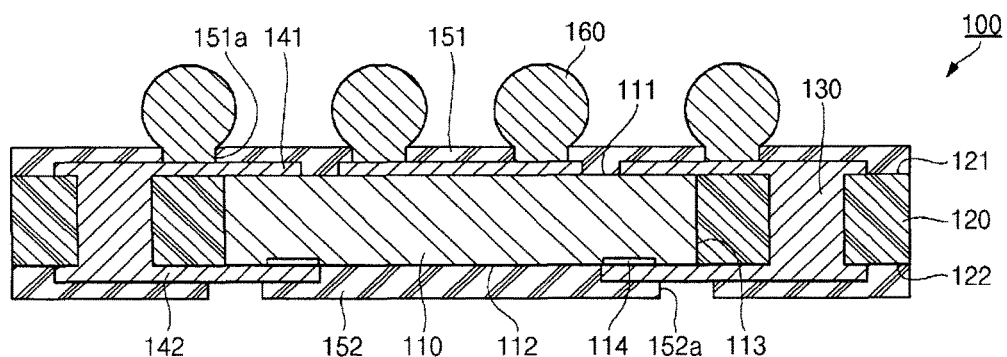
FIG. 1 is a cross-sectional view illustrating a wafer level fan out package according to an embodiment.

Referring to FIG. 1, a wafer level fan out package 100 according to an embodiment is illustrated in a cross-sectional view. The wafer level fan out package 100 according to the current embodiment includes a semiconductor die 110, a stiffener 120, a plurality of conductive vias 130, a first electrically conductive pattern 141, a second electrically conductive pattern 142, a first passivation layer 151, a second passivation layer 152, and a plurality of solder balls 160.

The semiconductor die 110 has a first surface 111 that is approximately planar, a second surface 112 that is approximately planar and opposed to the first surface 111, and a third surface 113 that connects the first and second surfaces 111 and 112 to each other. The second surface 112 of the semiconductor die 110 may be provided with one or more bond pads 114. The first surface 111 is sometimes called an inactive surface, the second surface 112 is sometimes called an active surface, and the third surface 113 is sometimes called the side of the semiconductor die 110.

The stiffener 120 extends a predetermined length outward from the third surface 113 of the semiconductor die 110. The stiffener 120 includes a first surface 121 that is approximately planar, and a second surface 122 that is approximately planar and opposed to the first surface 121. The first surface 121 of the stiffener 120 is approximately flush, i.e., lies in the same plane, with the first surface 111 of the semiconductor die 110, and the second surface 122 of the stiffener 120 is approximately flush with the second surface 112 of the semiconductor die 110. The stiffener 120 may be formed of one of various materials including an epoxy molding compound, but is not limited thereto. Generally, the stiffener 120 includes a dielectric material.

The conductive via 130 is spaced apart from the semiconductor die 110. That is, the conductive via 130 is spaced apart from the third surface 113 of the semiconductor die 110, and passes through the first and second surfaces 121 and 122 of the stiffener 120. The conductive via 130 may be formed of one of copper, a copper alloy, aluminum, an aluminum alloy, a plumbum-stannum (lead-tin) alloy, and an equivalent thereof, but is not limited thereto.

The first electrically conductive pattern 141 is disposed on both the first surface 111 of the semiconductor die 110 and the first surface 121 of the stiffener 120. The first electrically conductive pattern 141 is electrically connected to the conductive via 130. Substantially, the first electrically conductive pattern 141 electrically connects the conductive vias 130 to the solder balls 160 to be described later. The first electrically conductive pattern 141 may be formed of one of copper, a copper alloy, aluminum, an aluminum alloy, a nickel-titanium-tungsten alloy, and an equivalent thereof, but is not limited thereto.

The second electrically conductive pattern 142 is disposed on both the second surface 112 of the semiconductor die 110 and the second surface 122 of the stiffener 120. The second electrically conductive pattern 142 electrically connects the bond pads 114 of the semiconductor die 110 to the conductive vias 130. The second electrically conductive pattern 142 may be formed of one of copper, a copper alloy, aluminum, an aluminum alloy, a nickel-titanium-tungsten alloy, and an equivalent thereof, but is not limited thereto. In one embodiment, the first and second conductive patterns 141 and 142 include electrically conductive traces, e.g., discrete conductive lines, that extend lengthwise in the horizontal direction.

The first passivation layer 151 covers the first electrically conductive pattern 141. The first passivation layer 151 covers both the first surface 111 of the semiconductor die 110 and the first surface 121 of the stiffener 120 outside the first electrically conductive pattern 141. The first passivation layer 151 has openings 151a to expose predetermined portions of the first electrically conductive pattern 141. The openings 151a are disposed on the first electrically conductive pattern 141 over the semiconductor die 110 and the stiffener 120. The solder balls 160 may be welded to the first electrically conductive pattern 141 exposed through the openings 151a, or semiconductor devices may be mounted thereon.

The second passivation layer 152 covers the second electrically conductive pattern 142. The second passivation layer 152 covers both the second surface 112 of the semiconductor die 110 and the second surface 122 of the stiffener 120 outside the second electrically conductive pattern 142. The second passivation layer 152 includes openings 152a to expose predetermined portions of the second electrically conductive pattern 142. The solder balls 160 may be welded to the second electrically conductive pattern 142 exposed through the openings 152a, or semiconductor devices may be mounted thereon.

In this case, the mounted semiconductor devices may include a semiconductor die, a semiconductor chip, a semiconductor package, a passive device, and an equivalent thereof, but are not limited thereto.

The first and second passivation layers 151 and 152 may be formed of one of polyimide (PI), poly benz oxazole (PBO), benzo cyclo butene (BCB), epoxy, and an equivalent thereof, but are not limited thereto.

The solder balls 160 are welded to the first electrically conductive pattern 141 through the openings 151a of the first passivation layer 151. Alternatively, the solder balls 160 may be welded to the second electrically conductive pattern 142 through the openings 152a of the second passivation layer 152. That is, the solder balls 160 may be selectively welded to the first electrically conductive pattern 141 and/or the second electrically conductive pattern 142. Accordingly, the solder balls 160 are disposed on the stiffener 120 as well as the semiconductor die 110. As a result, the wafer level fan out package 100 is formed.

As described above, the stiffener 120 formed of a material such as a dielectric epoxy molding compound is disposed outside the semiconductor die 110, the stiffener 120 is provided with the first and second electrically conductive patterns 141 and 142 extending from the semiconductor die 110, and the solder balls 160 are welded to the first electrically conductive pattern 141 on both the semiconductor die 110 and the stiffener 120, thereby easily forming the wafer level fan out package 100.

Moreover, since the stiffener 120 is provided with the conductive vias 130, electrical paths from the bond pads 114 of the semiconductor die 110 to the solder balls 160 can be easily formed.

Referring to FIGS. 2A to 2H, a method of fabricating the wafer level fan out package 100 of FIG. 1 is illustrated in cross-sectional views according to an embodiment.

Although a single semiconductor die is exemplified hereinafter, the present disclosure is not limited to the number of semiconductor dies. That is, semiconductor dies may be arrayed in a matrix according to another embodiment, i.e., a plurality of wafer level fan out packages 100 can be fabricated simultaneously and then singulated from one another.

Figure 2A:
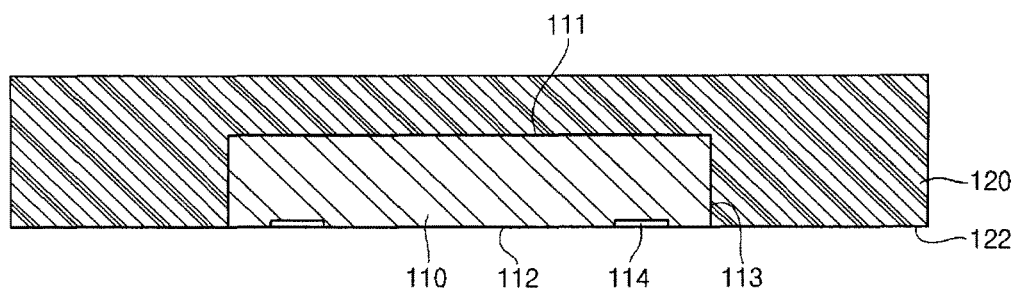
FIGS. 2A, 2B, 2C, 2D, 2E, 2F, 2G, and 2H are cross-sectional views illustrating a method of fabricating a wafer level fan out package according to another embodiment.

Referring to FIG. 2A, the semiconductor die 110 is prepared, which has the first surface 111, the second surface 112 opposed to the first surface 111 and provided with the bond pads 114, and the third surface 113 connecting the first and second surfaces 111 and 112 to each other.

At this point, the first surface 111 and the third surface 113 of the semiconductor die 110 are covered with the stiffener 120. The bond pads 114 and the second surface 112 of the semiconductor die 110 are exposed. The second surface 112 of the semiconductor die 110 is flush with the second surface 122 of the stiffener 120. The stiffener 120 may be formed of one of an epoxy molding compound and an equivalent thereof. The stiffener 120 may be formed using one of a compression molding method using a mold, a transfer molding method using a mold, and an equivalent thereof, but is not limited thereto.

Figure 2B:
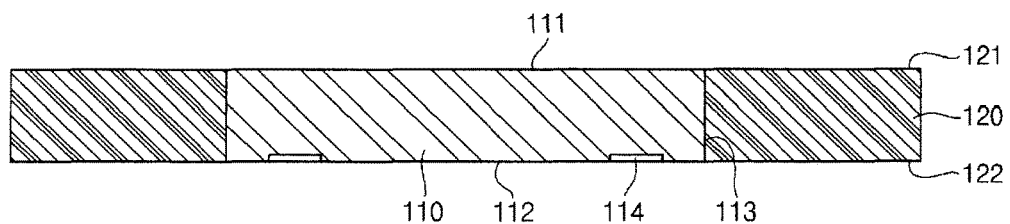

Referring to FIG. 2B, a portion of the stiffener 120 over the first surface 111 of the semiconductor die 110 is ground to expose the first surface 111 of the semiconductor die 110. Accordingly, the first surface 111 of the semiconductor die 110 is flush with the first surface 121 of the stiffener 120. In addition, the stiffener 120 extends a predetermined length outward from the third surface 113 of the semiconductor die 110. The first surface 111 of the semiconductor die 110 may still be covered with a thin residue layer of the stiffener 120.

Figure 2C:
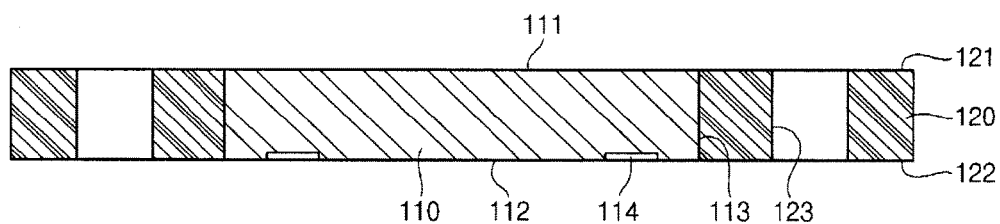
Figure 2D:
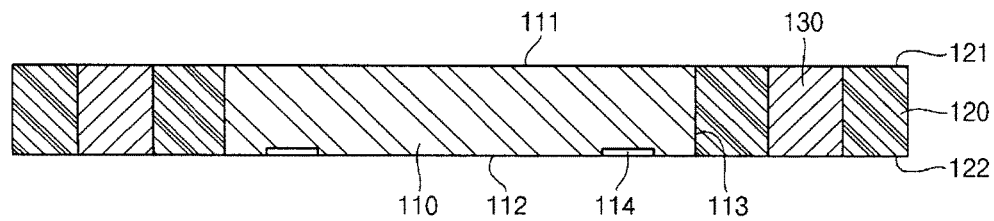

Referring to FIGS. 2C and 2D, through holes 123 passing through the first and second surfaces 121 and 122 of the stiffener 120 are formed, and are filled with the conductive vias 130.

The through holes 123 may be formed using etching, a drill, or a laser beam, but are not limited thereto.

The conductive vias 130 may be formed by depositing titanium or titanium tungsten (TiW), or performing an electroless plating process with copper and then performing an electro plating process with copper. Alternatively, the conductive vias 130 may be formed by filling the through holes 123 with copper paste and then performing a reflow process. Alternatively, the conductive vias 130 may be formed by filling the through holes 123 with solder paste and then performing a reflow process, but are not limited thereto. The through holes 123 and the conductive vias 130 extend entirely though the stiffener 120 and between the first and second surfaces 121 and 122.

Figure 2E:
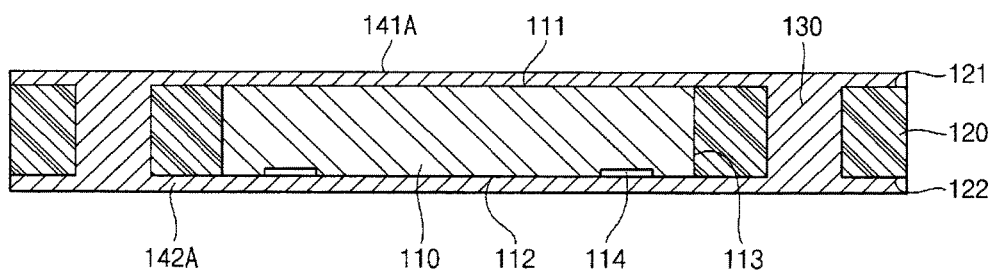

Referring to FIG. 2E, a first conductive layer 141A is formed on both the first surface 111 of the semiconductor die 110 and the first surface 121 of the stiffener 120. A second conductive layer 142A is formed on both the second surface 112 of the semiconductor die 112 and the second surface 122 of the stiffener 120. The first conductive layer 141A is electrically connected to the conductive vias 130, and the second conductive layer 142A is electrically connected to the bond pads 114 and the conductive vias 130. The first and second conductive layers 141A and 142A may be formed by performing an electroless plating process with copper and then performing an electro plating process with copper, but are not limited thereto.

Figure 2F:
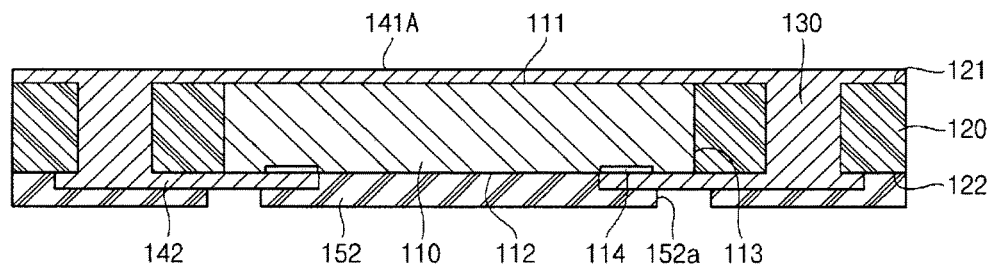

Referring to FIG. 2F, a typical photoetching process is performed on the second conductive layer 142A (FIG. 2E) to form the second electrically conductive pattern 142 (FIG. 2F). The second electrically conductive pattern 142 electrically connects the bond pads 114 to the conductive vias 130. The second surface 112 of the semiconductor die 110, and the second surface 122 of the stiffener 120 outside the second electrically conductive pattern 142, and the second electrically conductive pattern 142 are covered with the second passivation layer 152. The openings 152a may be formed on predetermined portions of the second electrically conductive pattern 142 to attach semiconductor devices or solder balls thereto.

Figure 2G:
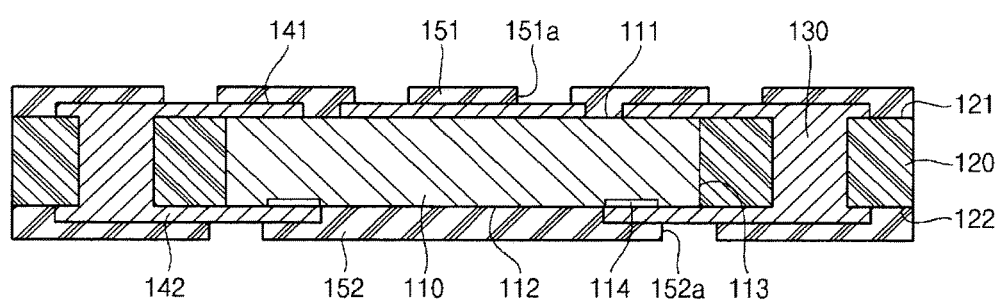

Referring to FIG. 2G, a typical photoetching process is performed on the first conductive layer 141A (FIG. 2F) to form the first electrically conductive pattern 141 (FIG. 2G). The first electrically conductive pattern 141 is electrically connected to the conductive vias 130. The first surface 111 of the semiconductor die 110, and the first surface 121 of the stiffener 120 outside the first electrically conductive pattern 141, and the first electrically conductive pattern 141 are covered with the first passivation layer 151. Openings 151a are formed on predetermined portions of the first electrically conductive pattern 141 to attach semiconductor devices or solder balls thereto.

Although the forming of the second electrically conductive pattern 142 is followed by the forming of the first electrically conductive pattern 141 in the current embodiment, the forming of the first electrically conductive pattern 141 may be followed by, or be simultaneous with, the forming of the second electrically conductive pattern 142 in other embodiments.

The first electrically conductive pattern 141 and the first passivation layer 151 may be repeatedly formed, and the second electrically conductive pattern 142 and the second passivation layer 152 may be repeatedly formed. Accordingly, multi-layered electrically conductive patterns may be formed.

Figure 2H:
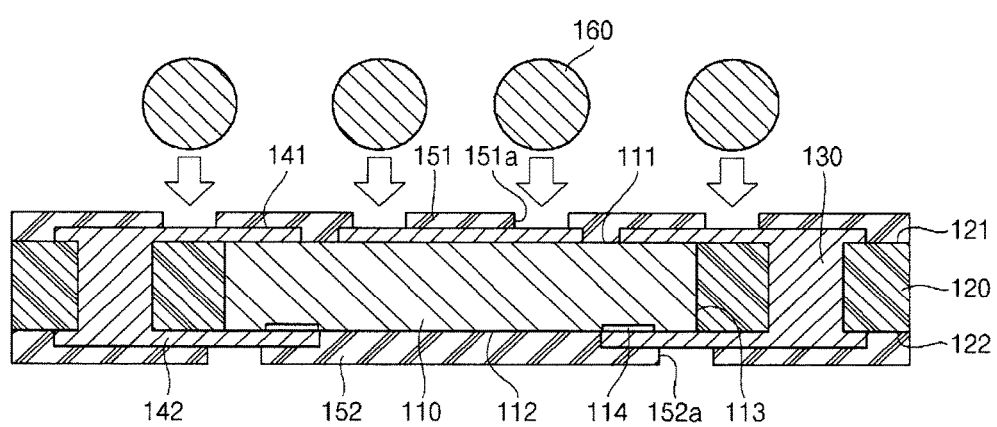

Referring to FIG. 2H, the solder balls 160 are attached to the first electrically conductive pattern 141 exposed through the openings 151a formed in the first passivation layer 151. For example, a flux is dotted on the first electrically conductive pattern 141 exposed through the openings 151a, then, the solder balls 160 are dropped on the flux, and then, a reflow process is performed at a temperature ranging from about 150° C. to about 250° C. Accordingly, the flux is evaporated, and the solder balls 160 are welded to the first electrically conductive pattern 141. After that, a cooling process is performed.

Figure 3:
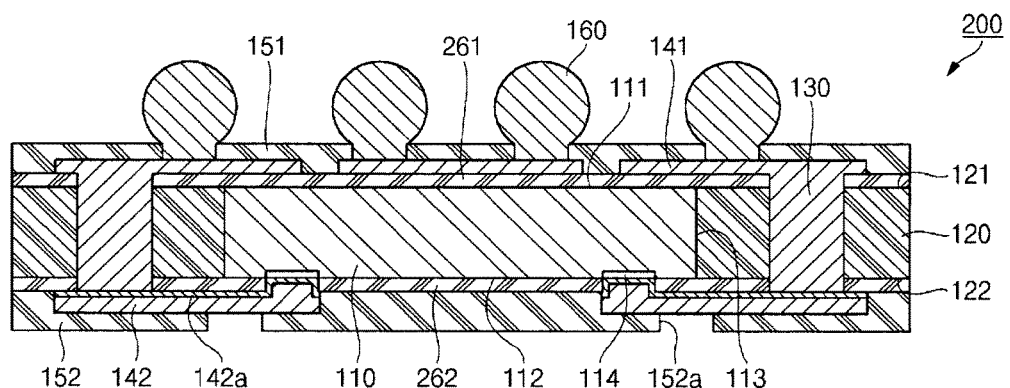
FIG. 3 is a cross-sectional view illustrating a wafer level fan out package according to another embodiment.

Referring to FIG. 3, a wafer level fan out package 200 according to another embodiment is illustrated in a cross-sectional view. The wafer level fan out package 200 according to the current embodiment includes the semiconductor die 110, the stiffener 120, a plurality of the conductive vias 130, a first electrically conductive pattern 141, a second electrically conductive pattern 142, the first passivation layer 151, the second passivation layer 152, a plurality of the solder balls 160, a first electric insulation layer 261, and a second electric insulation layer 262.

As such, since the wafer level fan out package 200 is similar to the wafer level fan out package 100 of FIG. 1, a description of the same part will be omitted.

The first electric insulation layer 261 is disposed between the first electrically conductive pattern 141 and the first surface 111 of the semiconductor die 110 and the first surface 121 of the stiffener 120. The conductive vias 130 pass through the first electric insulation layer 261.

The second electric insulation layer 262 is disposed between a second electrically conductive pattern 142 and the second surface 112 of the semiconductor die 110 and the second surface 122 of the stiffener 120. The conductive vias 130 pass through the second electric insulation layer 262.

The first and second electric insulation layers 261 and 262 may be formed of one of PI, PBO, BCB, epoxy, and an equivalent thereof, but are not limited thereto.

A barrier layer 142a formed of a material such as TiW may be disposed between the conductive via 130 and the bond pad 114 of the semiconductor die 110. The second electrically conductive pattern 142 may be disposed on the barrier layer 142a.

Accordingly, the first surface 121 of the stiffener 120 is covered with the first electric insulation layer 261, and the second surface 122 of the stiffener 120 is covered with the second electric insulation layer 262, thereby preventing the separation of a particle from the stiffener 120 while the wafer level fan out package 200 is fabricated. Thus, a contamination due to a particle can be prevented during the fabrication of the wafer level fan out package 200.

Referring to FIGS. 4A to 4H, a method of fabricating the wafer level fan out package 200 of FIG. 1 is illustrated in cross-sectional views according to another embodiment. A description of the same part as that of the previous embodiments will be omitted in the current embodiment.

Figure 4A:
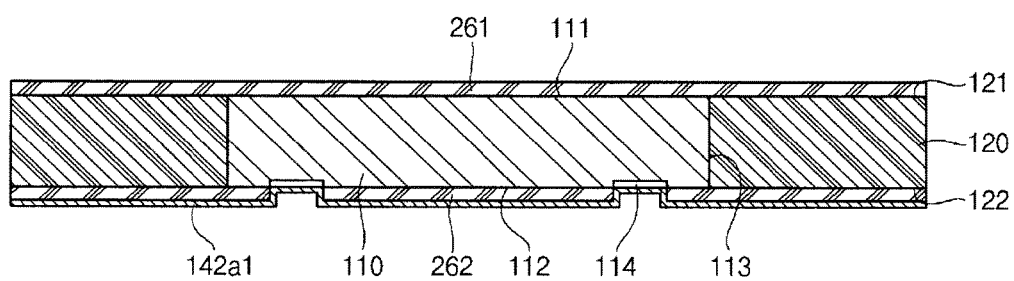
FIGS. 4A, 4B, 4C, 4D, 4E, 4F, 4G, and 4H are cross-sectional views illustrating a method of fabricating a wafer level fan out package according to another embodiment.

Referring to FIG. 4A, the first electric insulation layer 261 is formed on the first surface 111 of the semiconductor die 110 and the first surface 121 of the stiffener 120, and the second electric insulation layer 262 is formed on the second surface 112 of the semiconductor die 110 and the second surface 122 of the stiffener 120.

At this point, openings are formed in the second electric insulation layer 262 to expose the bond pads 114 of the semiconductor die 110. A barrier layer 142a1 is formed of a material such as TiW on the second electric insulation layer 262 and the bond pads 114. The barrier layer 142a1 protects the bond pads 114 during an etching process to be described later.

Figure 4B:
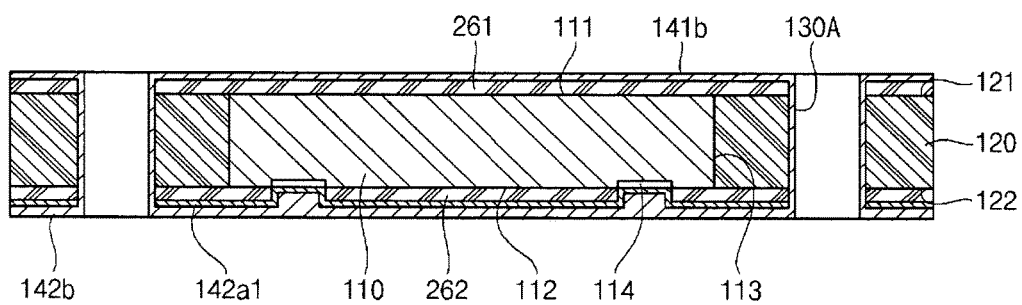

Referring to FIG. 4B, through holes passing through the stiffener 120, the first electric insulation layer 261, and the second electric insulation layer 262 are formed, and a conductive layer 130A is formed on surfaces defining the through holes. At this point, a conductive layer 141b is formed on the first electric insulation layer 261, and a conductive layer 142b is formed on the second electric insulation layer 262 and, more particularly, on the barrier layer 142a1. The conductive layers 130A, 141b, and 142b may be formed by performing an electroless plating process with copper, but are not limited thereto.

Figure 4C:
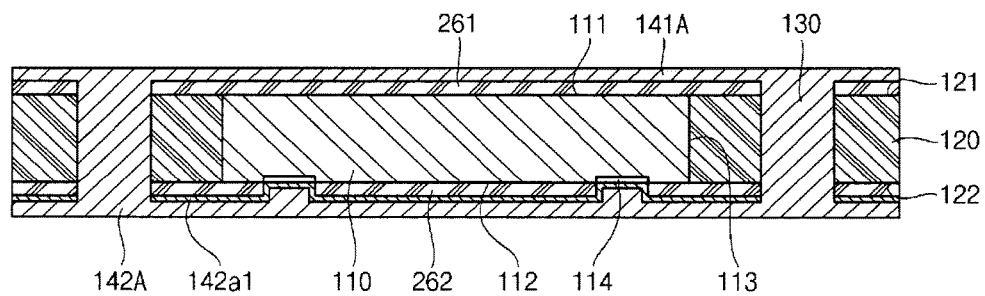

Referring to FIG. 4C, thick conductive layers are formed using the conductive layers 130A, 141b, and 142b as seeds. That is, the first conductive layer 141A is formed on the first electric insulation layer 261, the second conductive layer 142A is formed on the second electric insulation layer 262 including the barrier layer 142a1, and the conductive vias 130 are formed in the through holes.

The conductive vias 130 fill the through holes. The first and second conductive layers 141A and 142A, and the conductive vias 130 may be formed by performing an electro plating process with copper, but are not limited thereto.

Figure 4D:
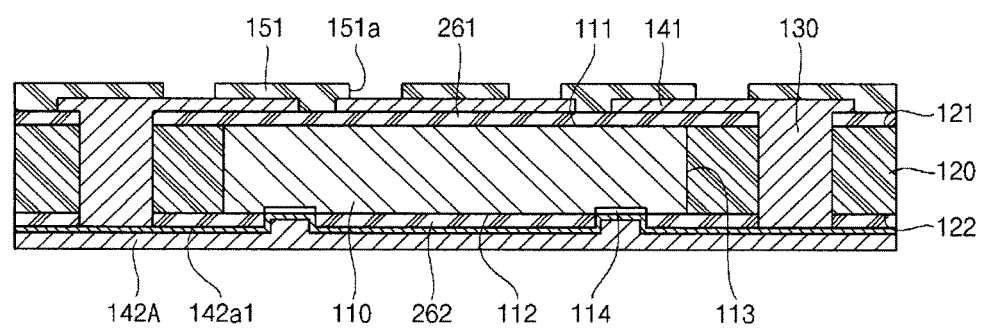

Referring to FIG. 4D, a typical photoetching process is performed on the first conductive layer 141A (FIG. 4C) to form the first electrically conductive pattern 141 (FIG. 4D). The first electrically conductive pattern 141 is electrically connected to the conductive vias 130. The first electrically conductive pattern 141 and portions of the first electric insulation layer 261 outside the first electrically conductive pattern 141 are covered with the first passivation layer 151. The openings 151a are formed on predetermined portions of the first electrically conductive pattern 141 to attach semiconductor devices or solder balls thereto.

Figure 4E:
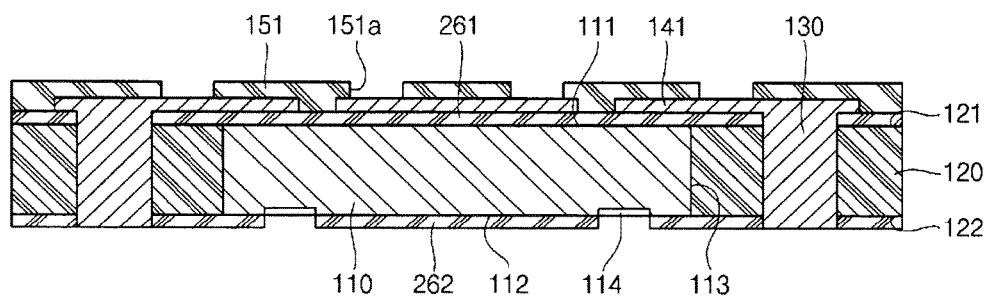

Referring to FIG. 4E, the second conductive layer 142A and the barrier layer 142a1 are completely removed through etching. Accordingly, the conductive vias 130 and the bond pads 114 are exposed. Also, the second electric insulation layer 262 is exposed. Unless the second conductive layer 142A and the barrier layer 142a1 are completely removed, a thick oxide layer may be formed on the second conductive layer 142A while the wafer level fan out package 200 is fabricated. In addition, at this point, the barrier layer 142a1 may be damaged. That is, since reliability of the second conductive layer 142A and the barrier layer 142a1 is low, the second conductive layer 142A and the barrier layer 142a1 are completely removed.

Figure 4F:
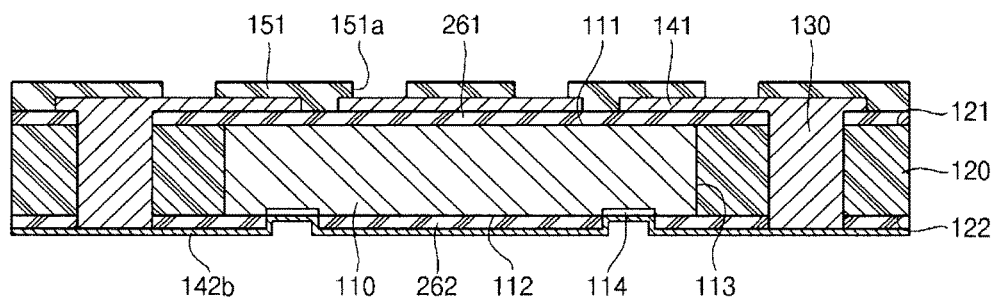

Referring to FIG. 4F, a barrier layer 142b is formed on the second electric insulation layer 262, the bond pads 114, and the conductive vias 130. For example, the barrier layer 142*b* may be formed of TiW through sputtering.

Figure 4G:
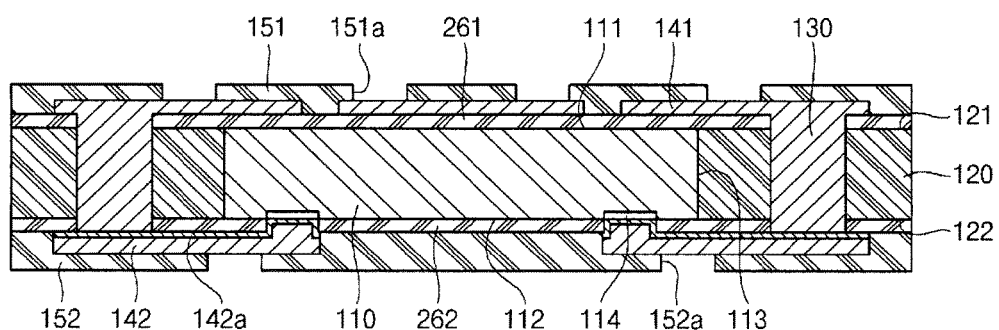

Referring to FIG. 4G, the second electrically conductive pattern 142 is formed on the barrier layer 142*a*. To form the second electrically conductive pattern 142 and the barrier layer 142*a*, a second electrically conductive layer is entirely formed on the barrier layer 142*b* (FIG. 4F) by performing an electroless plating process with copper or an electro plating process with copper. Then, a typical photoetching process is performed to pattern the second electrically conductive layer and the barrier layer 142*b* (FIG. 4F) into the second electrically conductive pattern 142 and the barrier layer 142*a* as shown in FIG. 4G.

After that, the second passivation layer 152 is formed on the second electrically conductive pattern 142 and the second electric insulation layer 262. The second passivation layer 152 includes the openings 152*a* to expose predetermined portions of the second electrically conductive pattern 142. Other semiconductor devices or solder balls may be welded through the openings 152*a*.

Figure 4H:
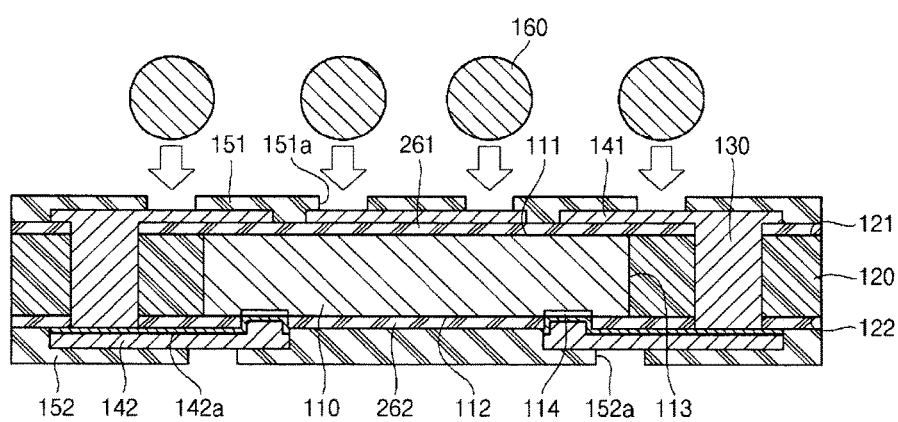

Referring to FIG. 4H, the solder balls 160 are welded to the predetermined portions of the first electrically conductive pattern 141 exposed through the openings 151*a* of the first passivation layer 151. Thus, the semiconductor die 110 is electrically connected to an external device through the first electrically conductive pattern 141, the conductive vias 130, the second electrically conductive pattern 142, and the solder balls 160.

Figure 5:
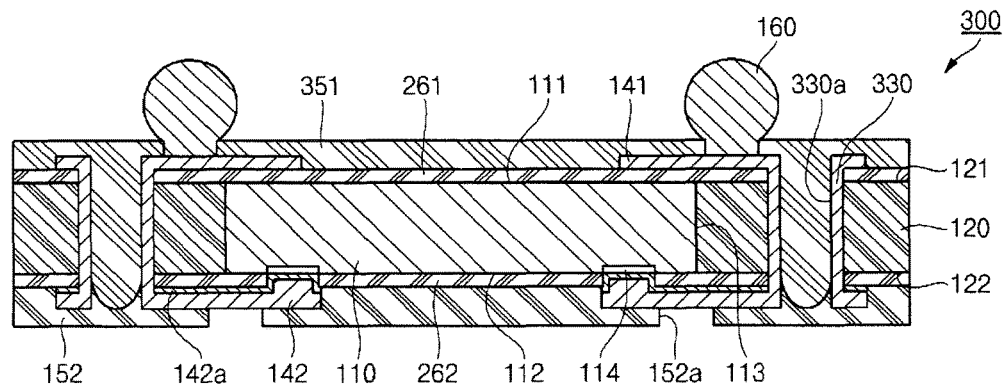
FIG. 5 is a cross-sectional view illustrating a wafer level fan out package according to another embodiment.

Referring to FIG. 5, a wafer level fan out package 300 according to another embodiment is illustrated in a cross-sectional view. The wafer level fan out package 300 according to the current embodiment includes the semiconductor die 110, the stiffener 120, a plurality of conductive vias 330, a first electrically conductive pattern 141, a second electrically conductive pattern 142, a first passivation layer 351, the second passivation layer 152, a plurality of the solder balls 160, the first electric insulation layer 261, and the second electric insulation layer 262.

As such, since the wafer level fan out package 300 is similar to the wafer level fan out package 200 of FIG. 3, a description of the same part will be omitted.

Through holes 330*a* pass through the conductive vias 330. Moreover, the first passivation layer 351 fills the through holes 330*a*. Accordingly, the first passivation layer 351 is connected to the second passivation layer 152.

Since the through holes 330*a* pass through the conductive vias 330, and the first passivation layer 351 as an electric insulation material fills the through holes 330*a*, electrical performance of the conductive vias 330 is further improved. That is, since the conductive vias 330 are provided in the form of a coaxial cable, an electrical signal is more reliably transmitted.

The first passivation layer 351 may be formed of one of PI, PBO, BCB, epoxy, and an equivalent thereof, but is not limited thereto.

Referring to FIGS. 6A to 6F, a method of fabricating the wafer level fan out package 300 of FIG. 5 is illustrated in cross-sectional views according to another embodiment.

Figure 6A:
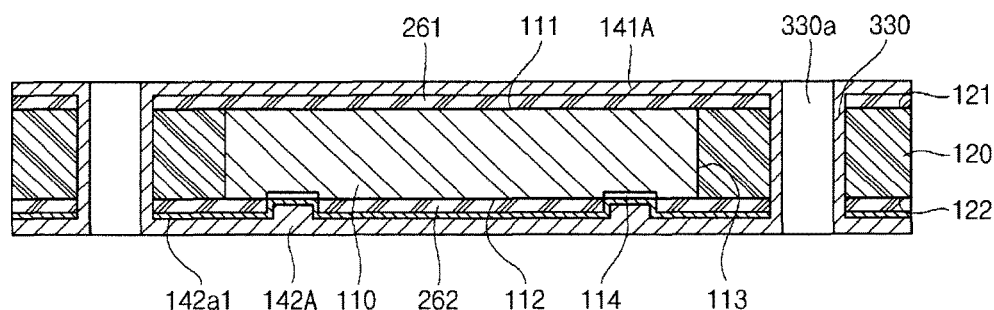
FIGS. 6A, 6B, 6C, 6D, 6E, and 6F are cross-sectional views illustrating a method of fabricating a wafer level fan out package according to another embodiment.

Referring to FIG. 6A, the first and second conductive layers 141A and 142A, and the conductive vias 330 including the through holes 330*a* are formed through a typical electroless plating process and a typical electro plating process.

Figure 6B:
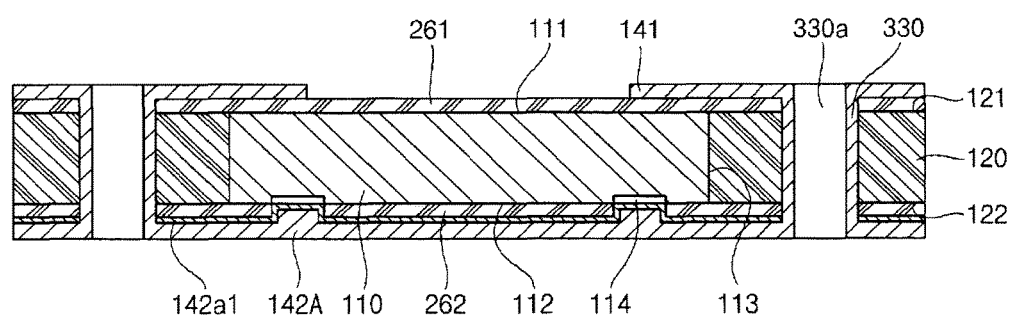

Referring to FIG. 6B, a typical photoetching process is performed on the first conductive layer 141A (FIG. 6A) to form the first electrically conductive pattern 141 (FIG. 6B).

Figure 6C:
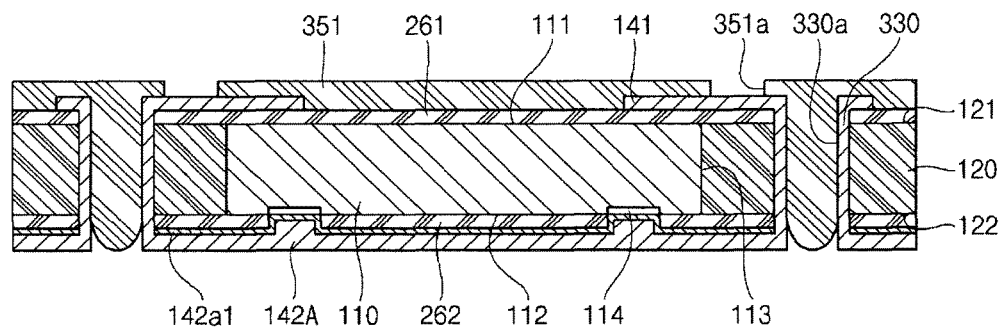

Referring to FIG. 6C, the first passivation layer 351 is formed on the first electrically conductive pattern 141. At this point, the first passivation layer 351 fills the through holes 330*a* of the conductive vias 330. The openings 351*a* are formed in the first passivation layer 351 to expose the predetermined portions of the first electrically conductive pattern 141.

Figure 6D:
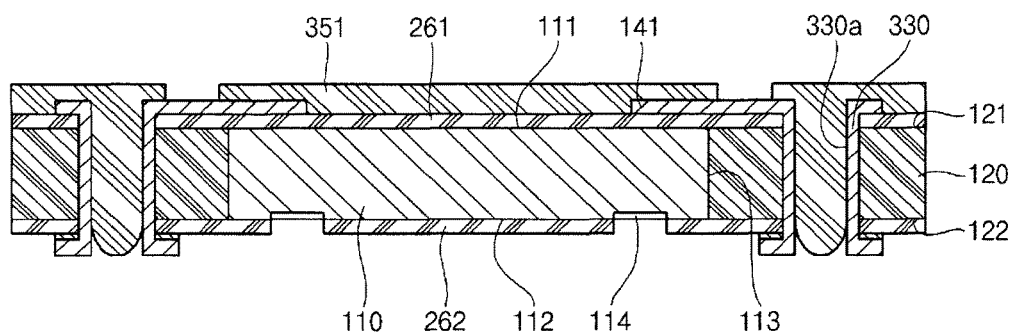

Referring to FIG. 6D, the second conductive layer 142A and the barrier layer 142*a*1 are removed through a typical etching process. Accordingly, the bond pads 114 of the semiconductor die 110 are exposed.

Figure 6E:
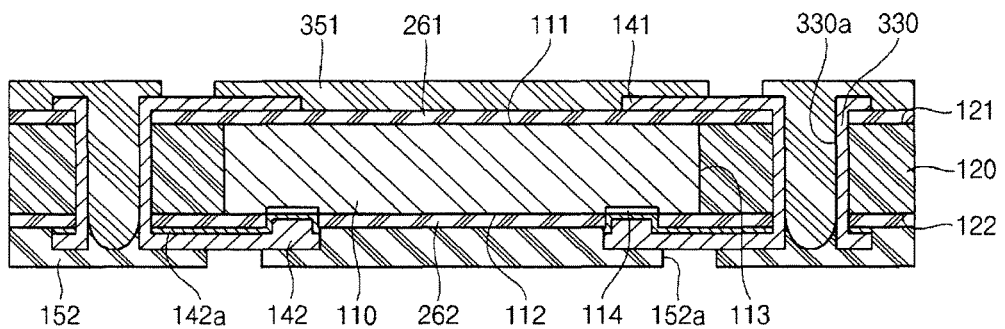

Referring to FIG. 6E, the barrier layer 142*a* and the second electrically conductive pattern 142 are formed. The second electrically conductive pattern 142 is electrically connected to the conductive vias 330. After that, the second passivation layer 152 is formed on the second electrically conductive pattern 142 and the second electric insulation layer 262.

At this point, the first passivation layer 351 is connected to the second passivation layer 152. The openings 152*a* are formed in the second passivation layer 152 to expose the predetermined portions of the second electrically conductive pattern 142. Other semiconductor devices or solder balls may be welded through the openings 152*a*.

Figure 6F:
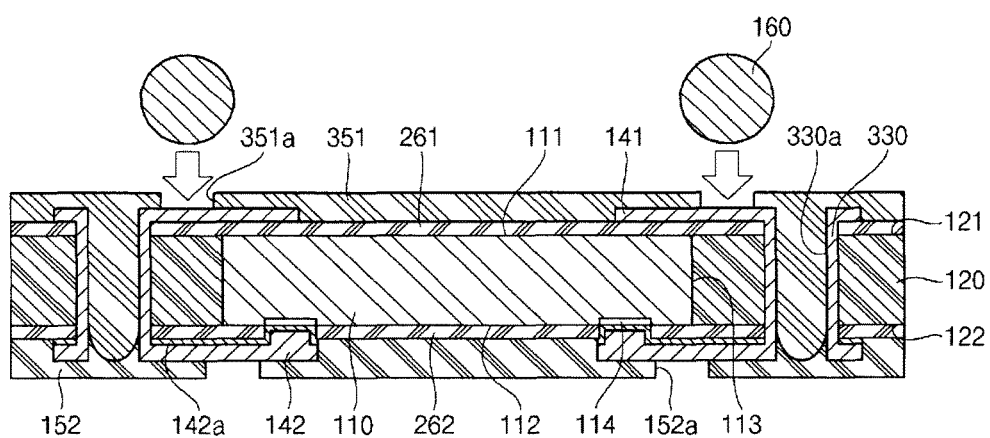

Referring to FIG. 6F, the solder balls 160 are welded to the predetermined portions of the first electrically conductive pattern 141 exposed through the openings 351*a* of the first passivation layer 351. Thus, the semiconductor die 110 is electrically connected to an external device through the first electrically conductive pattern 141, the conductive vias 330, the second electrically conductive pattern 142, and the solder balls 160.

Figure 7:
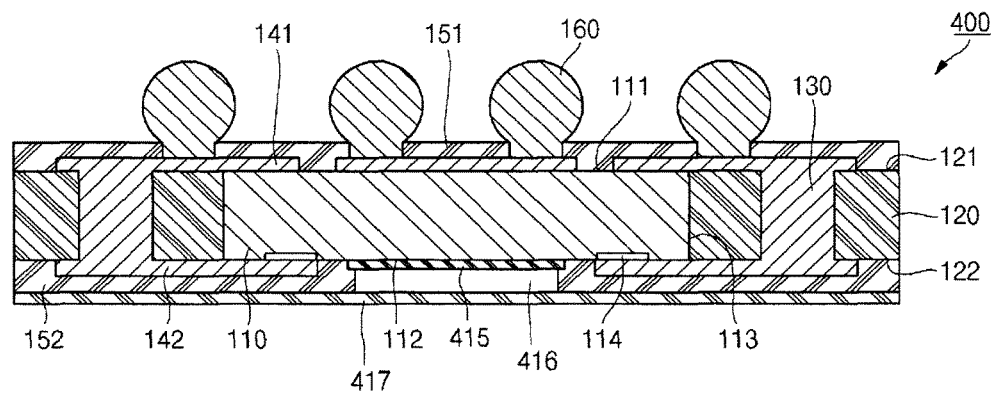
FIG. 7 is a cross-sectional view illustrating a wafer level fan out package according to another embodiment.

Referring to FIG. 7, a wafer level fan out package 400 according to an embodiment is illustrated in a cross-sectional view. A wafer level fan out package 400 according to the current embodiment includes a MEMS (Micro Electro Mechanical Systems) device 415 that is formed on the second surface 112 of the semiconductor die 110. Here, the first surface 111 of the semiconductor die 110 means an inactive surface, while the second surface 112 of the semiconductor die 110 means an active surface. Further, the MEMS device 415 includes an image sensor. Furthermore, since an empty space 416, sometimes called a MEMS opening 416, is formed in the second passivation layer 152 in a region corresponding to the MEMS device 415 of the semiconductor die 110, the MEMS device 415 can be mechanically or optically operated. More particularly, MEMS device 415 is exposed from second passivation layer 152 through the empty space 416.

In addition, a third passivation layer 417 may be formed over the MEMS device 415 and the empty space 416 so as to seal and protect the MEMS device 415 and the empty space 416 from the external environment. Of course, the third passivation layer 417 may be adhered to the second passivation layer 152. Here, the third passivation layer 417 may be transparent materials.

Figure 8:
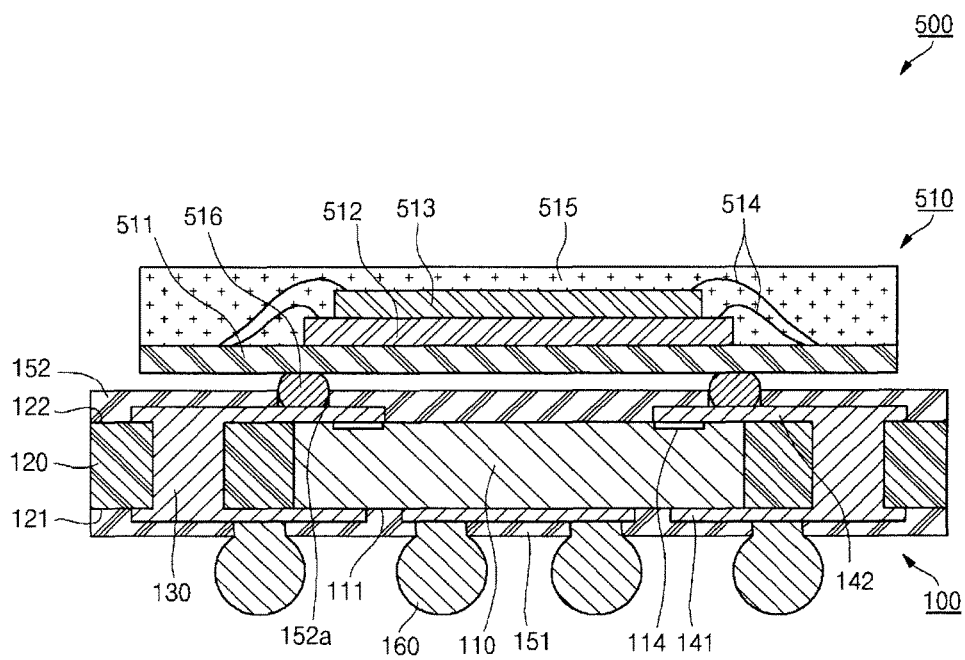
FIG. 8 is a cross-sectional view illustrating a wafer level fan out package according to another embodiment.

Referring to FIG. 8, a wafer level fan out package 500 according to an embodiment is illustrated in a cross-sectional view. The wafer level fan out package 500 according to the current embodiment includes a stack package 510. That is, a stack package 510 such as a memory or a chip size package may be coupled to the second electrically conductive pattern 142 of the wafer level fan out package 100. For example, the stack package 510 includes a substrate 511, a first semiconductor die 512, a second semiconductor die 513, a conductive wire 514, an encapsulant 515 and a solder ball 516. Here, the solder ball 516 is coupled to the second electrically conductive pattern 142.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method of making an electronic package, the method comprising:
   providing a semiconductor die comprising:
      a first die surface;
      a second die surface; and
      side die surfaces extending between the first die surface and the second die surface;
   forming a stiffener extending outward from at least one of the side die surfaces;
   forming a conductive via passing through the stiffener, wherein a conductor of the conductive via comprises a through hole;
   forming a first dielectric layer on the first die surface; and
   after said forming the first dielectric layer, forming a second dielectric layer on the second die surface, wherein the second dielectric layer is directly connected to the first dielectric layer,
   wherein said forming the first dielectric layer on the first die surface comprises forming the first dielectric layer directly on an insulation layer that is directly on the first die surface.

2. The method of claim 1, wherein the first dielectric layer and the second dielectric layer are connected to each other through the through hole in the conductor of the conductive via.

3. The method of claim 1, comprising:
   before said forming the first dielectric layer, forming a first conductive pattern on the first die surface and directly on a first stiffener surface, wherein the first stiffener surface is coplanar with the first die surface; and
   after said forming the first dielectric layer, patterning the first dielectric layer to expose a portion of the first conductive pattern,
   wherein said forming the first conductive pattern and said forming the conductive via comprise plating at least a portion of the first conductive pattern and at least a portion of the conductive via, respectively, in a same plating process.

4. The method of claim 1, wherein the first dielectric layer directly contacts and covers a first end surface of the conductive via.

5. The method of claim 3, comprising:
   before said forming the second dielectric layer, forming a second conductive pattern on the second die surface and on a second stiffener surface, wherein the second stiffener surface is substantially coplanar with the second die surface; and
   after said forming the second dielectric layer, patterning the second dielectric layer to expose a portion of the second conductive pattern,
   wherein said forming the second conductive pattern and said forming the conductive via comprise plating at least a portion of the second conductive pattern and at least a portion of the conductive via, respectively, in a same plating process.

6. The method of claim 1, wherein the conductive via comprises a lateral sidewall that is entirely laterally contacted and surrounded by insulating material.

7. A method of making an electronic package, the method comprising:
   providing a semiconductor die comprising:
      a first die surface;
      a second die surface; and
      side die surfaces extending between the first die surface and the second die surface;
   forming a stiffener extending outward from at least one of the side die surfaces;
   forming a conductive via passing through the stiffener, wherein a conductor of the conductive via comprises a through hole;
   forming a first dielectric layer on the first die surface; and
   after said forming the first dielectric layer, forming a second dielectric layer on the second die surface, wherein the second dielectric layer is directly connected to the first dielectric layer,
   wherein the second dielectric layer is directly connected to the first dielectric layer at a distinct interface.

8. The method of claim 7, wherein the distinct interface is in the through hole.

9. The method of claim 7, wherein the distinct interface has a concave shape.

10. A method of making an electronic package, the method comprising:
    providing a semiconductor die comprising:
       a first die surface;
       a second die surface; and
       side die surfaces extending between the first die surface and the second die surface;
    forming a stiffener extending outward from at least one of the side die surfaces;
    forming a conductive via passing through the stiffener, wherein a conductor of the conductive via comprises a through hole;
    forming a first dielectric layer on the first die surface, the formed first dielectric layer comprising a convex surface; and
    after said forming the first dielectric layer, forming a second dielectric layer on the second die surface, wherein the second dielectric layer comprises a concave surface that is directly connected to the convex surface of the first dielectric layer.

11. The method of claim 10, wherein the connected convex and concave surfaces are in the through hole in the conductor of the conductive via.

12. The method of claim 10, comprising:
    before said forming the first dielectric layer, forming a first conductive pattern on the first die surface and on a first stiffener surface, wherein the first stiffener surface is coplanar with the first die surface; and
    after said forming the first dielectric layer, patterning the first dielectric layer to expose a portion of the first conductive pattern,
    wherein said forming the first conductive pattern and said forming the conductive via comprise plating at least a portion of the first conductive pattern and at least a portion of the conductive via, respectively, in a same plating process.

13. The method of claim 10, wherein the first dielectric layer directly contacts and covers a first end surface of the conductive via.

14. The method of claim 12, wherein a second stiffener surface is substantially coplanar with the second die surface.

15. A method of making an electronic package, the method comprising:
- providing a semiconductor die comprising:
  - a first die surface;
  - a second die surface opposite the first die surface and comprising a bond pad; and
  - side die surfaces extending between the first die surface and the second die surface;
- forming a stiffener and a conductive via, wherein:
  - the stiffener extends outward from at least one of the side die surfaces, and wherein the stiffener comprises a first stiffener surface that is parallel to the first die surface, and a second stiffener surface that is parallel to the second die surface; and
  - the conductive via passes through the stiffener;
- providing a first signal distribution structure comprising:
  - a first conductive pattern on the first die surface, the first conductive pattern electrically connected to the conductive via; and
  - a first dielectric layer on the first die surface, wherein:
    - the first dielectric layer covers and directly contacts the stiffener;
    - the first dielectric layer covers at least a portion of a first end surface of the conductive via; and
    - the first dielectric layer is positioned such that there is no conductive layer directly between the first dielectric layer and the first die surface, and wherein a portion of the first conductive pattern is exposed for coupling to a package interconnection structure; and
- providing a second signal distribution structure comprising:
  - a second conductive pattern on the second die surface, the second conductive pattern electrically connected to the bond pad and to the conductive via; and
  - a second dielectric layer on the second die surface, wherein the second dielectric layer covers and directly contacts the stiffener, and covers at least a portion of a second end surface of the conductive via.

16. The method of claim 15, wherein the conductive via comprises a solid metal column comprising a first metal column end that extends only as far as the first stiffener surface.

17. The method of claim 15, wherein the first dielectric layer contacts the at least a portion of the first end surface of the conductive via.

18. The method of claim 16, wherein the solid metal column comprises a second metal column end that extends only to the second stiffener surface.

19. The method of claim 15, wherein the portion of the first conductive pattern is exposed for coupling to the package interconnection structure through an aperture in the first dielectric layer.

20. The method of claim 15, wherein the first stiffener surface is substantially coplanar with the first die surface.

* * * * *